(12) United States Patent
Karrer et al.

(10) Patent No.: US 11,058,005 B2
(45) Date of Patent: Jul. 6, 2021

(54) ELECTRONIC COMPONENT AND METHOD FOR PRODUCING AN ELECTRONIC COMPONENT

(71) Applicant: Vitesco Technologies Germany GMBH, Hannover (DE)

(72) Inventors: Helmut Karrer, Fürth (DE); Peter Volkert, Rednitzhembach (DE); Michael Taufer, Bayern (DE); Konrad Härder, Nuremberg (DE)

(73) Assignee: Vitesco Technologies Germany GmbH, Hannover (DE)

( * ) Notice: Subject to any disclaimer, the term of this patent is extended or adjusted under 35 U.S.C. 154(b) by 0 days.

(21) Appl. No.: 16/696,631

(22) Filed: Nov. 26, 2019

(65) Prior Publication Data

US 2020/0100364 A1     Mar. 26, 2020

Related U.S. Application Data

(63) Continuation of application No. PCT/EP2018/064223, filed on May 30, 2018.

(30) Foreign Application Priority Data

Jun. 1, 2017     (DE) ..................... 10 2017 209 278.5

(51) Int. Cl.
    *H05K 1/18*         (2006.01)
    *H05K 1/11*         (2006.01)
    (Continued)

(52) U.S. Cl.
    CPC ............ *H05K 1/184* (2013.01); *H05K 1/113* (2013.01); *H05K 3/28* (2013.01); *H05K 3/3447* (2013.01);
    (Continued)

(58) Field of Classification Search
    CPC .......... H05K 1/184; H05K 1/113; H05K 3/28; H05K 3/3447; H05K 2201/10568;
    (Continued)

(56) References Cited

U.S. PATENT DOCUMENTS

2003/0143060 A1    7/2003   Will et al.
2013/0314878 A1*   11/2013   Ott ......................... H05K 5/062
                                                          361/720

(Continued)

FOREIGN PATENT DOCUMENTS

DE           10017774 A1     10/2001
DE      102007045630 A1     4/2009

(Continued)

OTHER PUBLICATIONS

International Search Report and Written Opinion dated Oct. 18, 2018 from corresponding International Patent Application No. PCT/EP2018/064223.

(Continued)

*Primary Examiner* — Sherman Ng

(57) ABSTRACT

An electronic component (E), including at least one circuit carrier (1), which is populated with a number of mechanical and/or electronic component parts (2 to 4) and has at least one contact opening (1.3) for forming a mechanical and/or electrical contact-connection point (KS) to at least one of the component parts (2 to 4), wherein at least one of the component parts (4)

is at a distance from the circuit carrier (1), includes at least one electrically conductive housing (4.1) and at least one electrical contact element (4.2) projecting out of the housing (4.1), the contact element being insulated from the housing (4.1) and being connected at least in a materially bonded manner to the contact opening (1.3) of the circuit carrier (1), wherein (Continued)

at least one seal element (5) is arranged in the region of the contact-connection point (KS), in particular between the circuit carrier (1) and the housing (4) of the component part (4).

22 Claims, 4 Drawing Sheets

(51) Int. Cl.
    *H05K 3/28*     (2006.01)
    *H05K 3/34*     (2006.01)

(52) U.S. Cl.
    CPC .............. *H05K 2201/10568* (2013.01); *H05K 2201/10628* (2013.01); *H05K 2201/10901* (2013.01); *H05K 2201/10977* (2013.01); *H05K 2201/2036* (2013.01); *H05K 2203/1147* (2013.01)

(58) Field of Classification Search
    CPC .......... H05K 2201/10628; H05K 2201/10901; H05K 2201/10977; H05K 2201/2036; H05K 2203/1147

USPC ......................................................... 361/720

See application file for complete search history.

(56) References Cited

U.S. PATENT DOCUMENTS

| 2014/0347819 | A1* | 11/2014 | Ott ....................... B60R 16/0231 |
| | | | 361/714 |
| 2016/0165727 | A1* | 6/2016 | Liskow ................. B29C 65/542 |
| | | | 361/803 |

FOREIGN PATENT DOCUMENTS

| DE | 102011086896 | A1 | 5/2013 |
| DE | 102015225099 | A1 | 6/2017 |
| EP | 2251879 | A1 | 11/2010 |

OTHER PUBLICATIONS

German Search Report dated Sep. 11, 2018 for corresponding German Patent Application No. 10 2017 209 278.5.

\* cited by examiner

ELECTRONIC COMPONENT AND METHOD FOR PRODUCING AN ELECTRONIC COMPONENT

CROSS-REFERENCE TO RELATED APPLICATIONS

This application claims the benefit of PCT Application PCT/EP2018/064223, filed May 30, 2018, which claims priority to German Application DE 10 2017 209 278.5, filed Jun. 1, 2017. The disclosures of the above applications are incorporated herein by reference.

FIELD OF THE INVENTION

The invention relates to an electronic component and a method for producing such an electronic component.

BACKGROUND OF THE INVENTION

Electronic components, which are used, for example, as transmission control devices in vehicles, are generally known. Here, the electronic component usually includes electronic component parts, which are arranged on a printed circuit board and form a circuit arrangement. The electronic component parts are electrically conductively connected to sensors and/or actuators and/or to connection plugs, for example, by means of lead frames for the purpose of voltage supply and for conducting signals, for example control signals or measurement signals to or from the electronic or electromechanical component parts.

To produce such an electronic component, in particular one or both outer layers of the printed circuit board is or are populated with electronic component parts. This is effected, for example, by means of soldering. Furthermore, it is known to embed electronic component parts into the printed circuit board. To protect against external influences and aging processes, the electronic component parts and/or the connecting points, for example the soldering points, are protected by means of certain lacquering and/or casting processes.

SUMMARY OF THE INVENTION

The invention is based on the object of specifying an electronic component that is improved with respect to the prior art and an improved method.

With respect to the electronic component, the object is achieved according to the invention using the features to be described herein. With respect to the method, the object is achieved according to the invention using the features which are also described herein.

Advantageous refinements of the invention are the subject matter also described.

The electronic component according to the invention includes at least one circuit carrier, which is populated with a number of mechanical and/or electronic component parts and has at least one contact opening for forming a mechanical and/or electrical contact-connection point to in each case one contact element of a respective component part. The at least one component part is arranged at a distance from the circuit carrier, includes at least one electrically conductive housing and at least one electrical contact element projecting out of the housing, the contact element being insulated from the housing and being connected at least in a materially bonded manner to the contact opening of the circuit carrier. Furthermore, at least one seal element is arranged in the region of the contact-connection point, in particular of the contact element and the contact opening, between the circuit carrier and the housing of the component part.

For example, the circuit carrier has two surface sides, which are each able to be populated with at least one electronic component part. In this case, an electronic component part is arranged on one of the two surface sides, for example on a bottom surface side, while the other surface side, for example the top surface side, is arranged and secured in an installation space of the vehicle.

The contact-connection point, in particular a soldering point, is sealed off by means of the seal element in materially bonded, in particular thermal, connecting methods. In addition, the electrically conductive housing is able to be arranged at a prescribed distance from the circuit carrier. As a result, in particular, an undesired electrically conductive contact-connection region between the housing and the circuit carrier is prevented in a simple manner. In particular, the housing of the component part is protected in the region of the contact opening and therefore of the electrical contact element against, for example, heat that is applied for the materially bonded connection of the contact element to the contact opening. In addition, the region of the contact element projecting out of the housing is protected against external influences and substantially insulated toward the outside.

For example, the contact element and the contact opening are able to be connected to one another by means of a thermal connecting method, such as, for example, a welding connection or soldering connection. In particular, the contact-connection point is able to be produced by means of the soldering connection.

If the electrical contact element is now secured in and to the contact opening by means of the soldering connection, it is possible to prevent an electrical short circuit during the soldering connection method by means of the seal element. In particular, the contact-connection point, in particular the soldering point, is sealed off and in the process an electrical short circuit between the electrical contact element and the electrically conductive housing is prevented from arising. Although the electrical contact element is insulated from the housing, bypassing of the housing region that is electrically insulated from the contact element may arise during soldering by means of, for example, a soldering material, in particular soldering tin.

In particular, soldering tin is prevented from being able to penetrate the housing by means of the seal element arranged in the region of the contact opening and between the circuit carrier and the housing.

Furthermore, at least mechanical loading due to shocks, which arise, for example, during vehicle operation and have an effect on the electronic component or on the circuit carrier and/or the component part, is improved to the greatest possible extent by means of the seal element.

One possible refinement of the electronic component makes provision for the contact opening formed in the circuit carrier to be a via and to be formed as a soldering land. In one development, the contact opening may include a number of soldering lands, wherein both surface sides of the circuit carrier are provided with a respective soldering land in the region of the contact opening. As a result, mechanical securing, which is able to be produced easily, and electrical contact-connection of the contact element to the circuit carrier is possible.

A further refinement of the electronic component makes provision for the contact element to be partly or completely surrounded by the seal element. In particular, the seal element is arranged on the bottom surface side of the circuit carrier and has a contact-connection region to the contact element of the component part. Undesired penetration of soldering materials into prescribed connecting regions of the contact opening and of the contact element is therefore able to be prevented.

In accordance with a further exemplary embodiment of the electronic component, the seal element is arranged in each case at a distance from the circuit carrier and/or from the housing of the component part. If, for example, the seal element is arranged at a distance from the circuit carrier, in particular from the bottom surface side, the soldering material may spread out up to the seal element. As a result, a comparatively larger soldering connection is able to be achieved, for example. A reduction or even prevention of temperature influence or transmission on or to the component part is made possible, for example, by means of the seal element at a distance from the component part, in particular the housing of the component part.

In a further possible embodiment of the electronic component, the seal element has contact-connection regions both to the circuit carrier and to the contact element and to the housing of the component parts. The seal element arranged between the circuit carrier and the component part is able to be used, for example, as a spacer.

In accordance with a further exemplary embodiment of the electronic component, the seal element is formed as an O-ring. Such a seal element is able to be produced or able to be purchased in the most cost-effective manner possible and able to be used in a simple manner. Furthermore, simple exchangeability, disassembly and assembly of the seal element is possible.

In accordance with one possible development of the electronic component, the seal element is at least partly formed from plastic. Furthermore, the seal element is produced, for example, by means of a primary formation method. For example, the seal element is able to be produced by means of an injection molding method. In this case, the seal element is able to be adapted to the electrical contact element, in particular to the dimensions and/or shape thereof, and to a design of the circuit carrier and/or of the component part housing.

A further embodiment of the electronic component makes provision for a housing wall of the housing oriented in the direction of the circuit carrier to include a passage opening, which electrically insulates the contact element and serves for feeding through the contact element. For example, the passage opening is provided with an electrical insulation element, through which the contact element is able to be fed. In this case, the electrical contact element is substantially insulated from the electrically conductive housing. For example, the housing is formed from metal. The electrical insulation element is, for example, an insulator arranged at the passage opening and connected thereto in a materially bonded, force-fitting and/or form-fitting manner. In particular, the insulation element is formed as a glass feed-through or plastic feed-through. For example, the passage opening is coated with an electrically insulating material.

In a further exemplary embodiment of the electronic component, the electrical contact element is formed as a contact pin, in particular a contact pin and/or connection pin.

In the method according to the invention for producing an electronic component, a number of contact openings are provided in a circuit carrier for mechanical and/or electrical contact-connection of in each case one contact element of a respective mechanical and/or electronic component part. The circuit carrier is populated with the number of mechanical and/or electronic component parts, wherein at least one of the component parts is arranged at a distance from the circuit carrier, includes at least one electrically conductive housing, and at least one electrical contact element fed through the housing to the outside and insulated from the housing, the contact element being provided in the region of a contact-connection point to the contact opening formed in the circuit carrier with at least one seal element so that the the seal element is arranged between the circuit carrier and the housing of the component part, and is fed into the contact opening and is connected at least in a materially bonded manner thereto. By way of this method, it is possible to seal off the connecting region between the contact element and the contact opening in particular in the case of materially bonded, in particular thermal, connection of the contact element in and/or to the contact opening.

One possible embodiment of the method makes provision for the electrical contact element to be soldered in and to the contact opening formed in the circuit carrier. In particular, a stable and simple connection between the electronic component part and the circuit carrier is able to be achieved.

In a further possible formation of the method, the contact-connection point is sealed off from the housing by means of the seal element. In particular, for example, the soldering point is sealed off so that the soldering material in the region of the contact opening and the contact element does not come into contact with the electrically insulated region of the housing. In this case, an electrical short circuit during the connecting method is prevented.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Exemplary embodiments of the invention are explained in more detail below with reference to drawings.

In the drawings.

DETAILED DESCRIPTION OF THE PREFERRED EMBODIMENTS

The following description of the preferred embodiment(s) is merely exemplary in nature and is in no way intended to limit the invention, its application, or uses.

Figure 1:
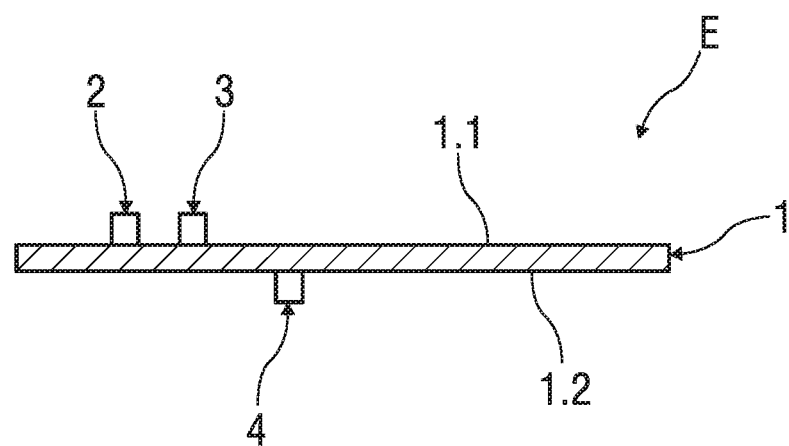
FIG. 1 schematically shows a sectional illustration of a side view of an electronic component, FIG. 2 schematically shows a sectional illustration of a side view of an electronic component part connected to a circuit carrier, FIG. 3 schematically shows an exemplary embodiment of the electronic component part connected to the circuit carrier as per FIG. 2 and FIGS. 4 and 5 schematically show further exemplary embodiments of the electronic component part connected to the circuit carrier as per FIG. 2.

FIG. 1 shows a sectional illustration of an electronic component E, for example a transmission or engine control device for a vehicle, which is not illustrated in more detail. The electronic component E is therefore embodied, in particular, as an electromechanical component. Alternatively, the electronic component E may also include or constitute another desired electronic circuit arrangement.

The electronic component E includes a circuit carrier 1, which is populated with a number of mechanical and/or electronic component parts 2 to 4. For example, the electronic component parts 2 to 4 are electrically conductively connected to sensors and/or actuators and/or to connection plugs, for example by means of lead frames for the purpose of voltage supply and for conducting signals, for example control signals or measurement signals to or from the electronic or electromechanical component parts 2 to 4.

The circuit carrier 1 is formed, for example, as a printed circuit board or as a substrate and serves for mechanically securing and electrically connecting the electronic component parts 2 to 4. For example, the circuit carrier 1 is formed from electrically insulating, fiber-reinforced plastic or from ceramic. In one development, the circuit carrier 1 may be of single-layer or multi-layer form depending on use. In this case, the circuit carrier 1 may be of mechanically rigid or flexible form.

Furthermore, the circuit carrier 1 has two surface sides 1.1, 1.2, which are each able to be populated with at least one electronic component part 2 to 4.

Alternatively, an electronic component part 4 is arranged only on one of the two surface sides 1.1, 1.2, for example only on the bottom surface side 1.2, while the other of the two surface sides 1.1, 1.2, for example the top surface side 1.1, is arranged and secured in an installation space of the vehicle.

Figure 2:
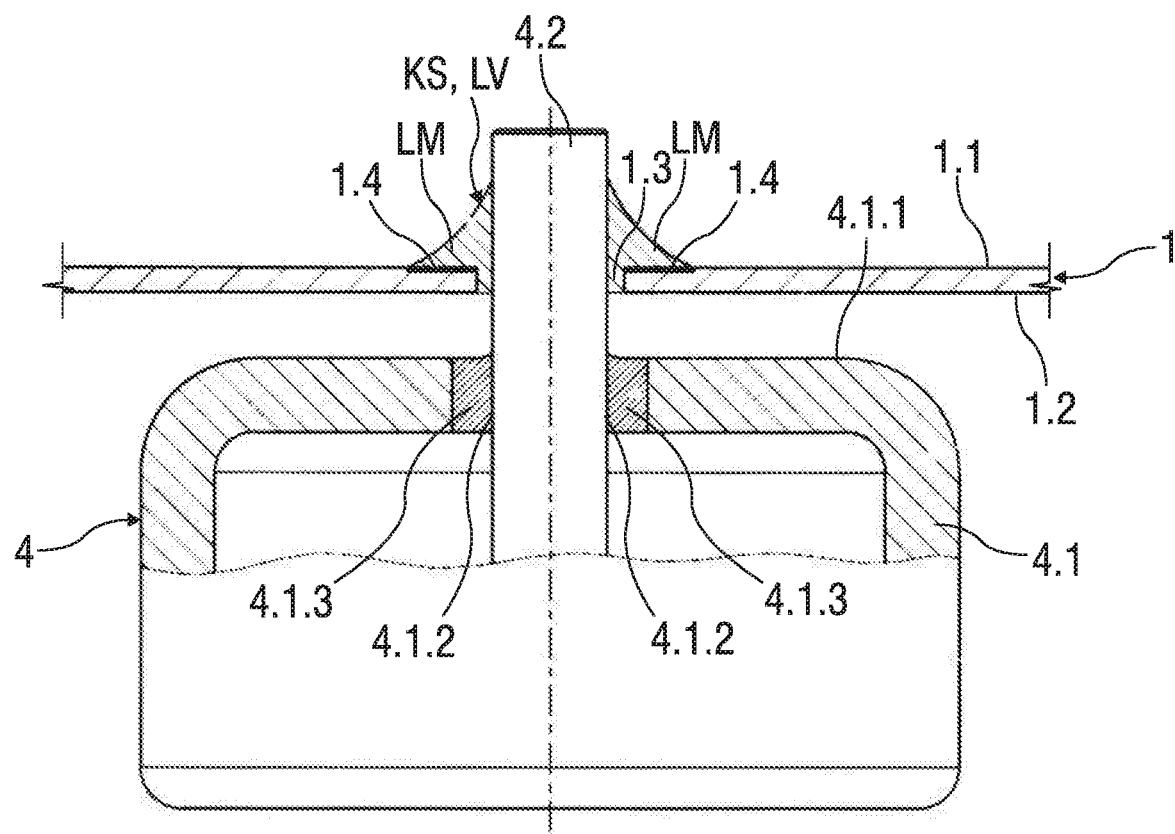

FIG. 2 shows an exemplary embodiment of the electronic component part 4 arranged on the bottom surface side 1.2.

To secure the component part 4 to the circuit carrier 1 and, in particular, to electrically connect the component part 4 to the circuit carrier 1 and/or to an inner and/or outer area of the electronic component E, the circuit carrier 1 has a contact opening 1.3. In this case, the contact opening 1.3 is formed as a via. In one development, which is not illustrated in any more detail, the circuit carrier 1 includes a multiplicity of contact openings 1.3 and, for example, line openings, such as conductor tracks.

The contact opening 1.3 includes, in particular, a soldering land 1.4, which encircles, for example, the contact opening 1.3. For example, a via opening is provided with a copper ring.

The electronic component part 4 includes an electrically conductive housing 4.1. In this case, the housing 4.1 is at least partly formed, for example, from metal and is provided, for example, to house a number of electrical and/or electronic component parts, which are not shown in any more detail, for example sensor elements, electrical lines, light elements. Furthermore, the housing 4.1 is formed to receive a number of electrical lines and, in particular, electrical contact elements 4.2.

In the exemplary embodiment illustrated, an electrical contact element 4.2 is shown, which projects out of the housing 4.1 and is insulated from the housing 4.1. For example, the electrical contact element 4.2 is formed as an electrical contact pin, soldering pin and/or connection pin.

In particular, the electrical contact element 4.2 is fed through a passage opening 4.1.2 formed in a housing wall 4.1.1 and is arranged so as to protrude from the housing wall 4.1.1 in the direction of the circuit carrier 1. The housing 4.1, in particular the housing wall 4.1.1, is oriented in the direction of the circuit carrier 1 and arranged at a distance from the circuit carrier 1.

To feed through the electrical contact element 4.2 in the region of the passage opening 4.1.2 in an insulated manner, the passage opening 4.1.2 is of electrically insulating form. In this case, the passage opening 4.1.2 is provided, for example, with an electrical insulation element 4.1.3. For example, the electrical insulation element 4.1.3 is connected to the passage opening 4.1.2 in a materially bonded manner, for example by means of a welding or adhesively bonding connection. Furthermore, the passage opening 4.1.2 may be formed with a surrounding ring element formed from electrically insulating material. For example, the electrical insulation element 4.1.3 is at least partly formed from glass, plastic and/or from another electrically non-conductive material.

To electrically and mechanically connect the contact element 4.2 and therefore the component part 4 to the circuit carrier 1, the electrical contact element 4.2 is connected at least in a materially bonded manner to the contact opening 1.3 of the circuit carrier 1. In this case, in particular the contact opening 1.3 forms an electrical and/or mechanical contact-connection point KS to secure the electronic component part 4, in particular the electrical contact element 4.2. For example, the contact-connection point KS is able to be produced by means of a soldering connection LV, wherein the electrical contact element 4.2 is secured in and to the contact opening 1.3 by means of the soldering connection LV.

Figure 3:
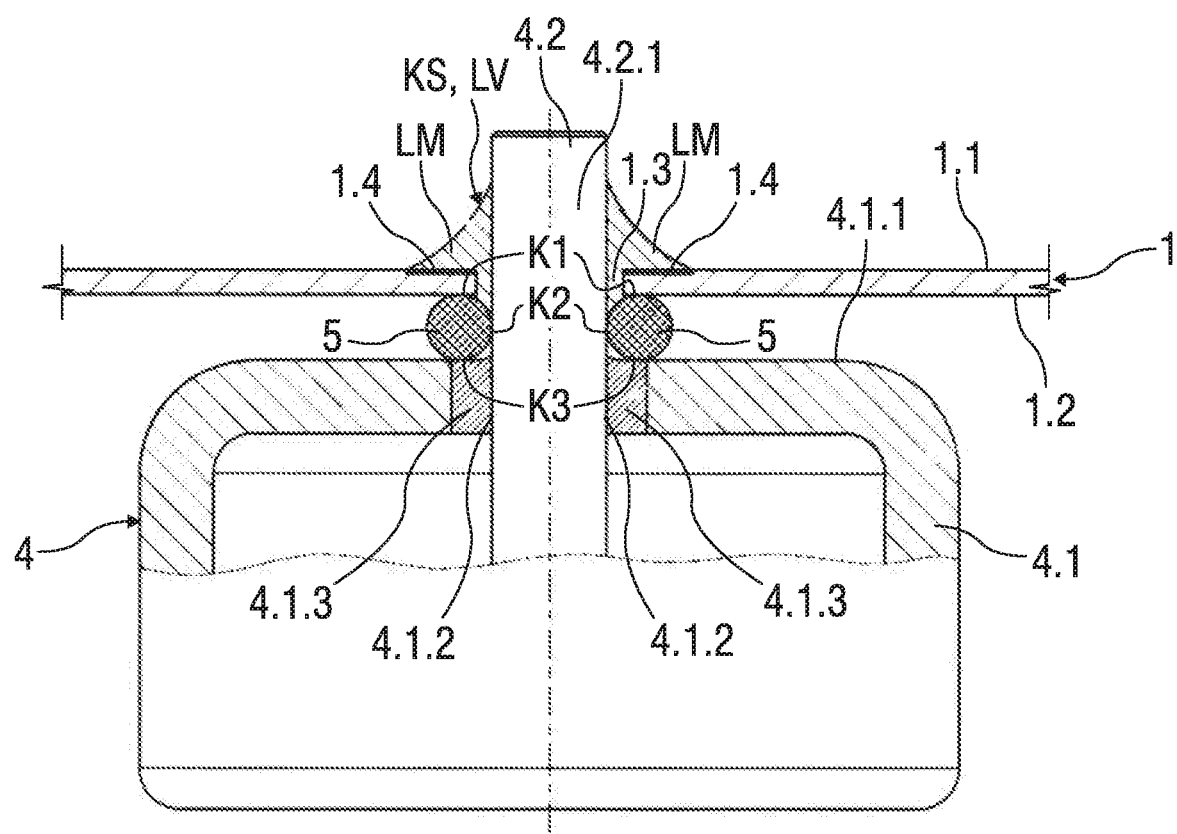

To improve the electrical and mechanical connection and, in particular, to prevent an electrical short circuit that may arise during soldering, the exemplary embodiment according to the invention of the electronic component part 4 connected to the circuit carrier 1 is proposed in FIG. 3.

The circuit carrier 1 includes the contact opening 1.3 to receive and feed through the electrical contact element 4.2 of the component part 4. To form the contact-connection point KS, the contact element 4.2 is fed through the contact opening 1.3 and arranged so as to protrude from the surface side 1.1 of the circuit carrier 1. In this case, the contact opening 1.3 has a greater dimension, in particular a greater diameter, than the electrical contact element 4.2. The contact-connection point KS is provided inside and on the surface side 1.1 to execute a thermal connecting method, in particular thermal joining, by way of a soldering material LM.

The housing 4.1 of the component part 4 is of electrically conductive form. To feed through the electrical contact element 4.2 in an insulated manner, the passage opening 4.1.2 has the insulation element 4.1.3. In particular, the passage opening 4.1.2 is provided with the insulation element 4.1.3, which is formed, for example, as a glass feedthrough, for example by means of a materially bonded, force-fitting and/or form-fitting connection. In this case, the housing 4.1 itself is formed from electrically conductive metal.

The contact opening 1.3 formed in the circuit carrier 1 is formed as a via and, to form the contact-connection point KS by means of the soldering connection LV, includes the soldering land 1.4.

In order that an electrical short circuit between the contact element 4.2 and the housing 4.1 does not arise during soldering, a seal element 5 is arranged in the region of the contact-connection point KS between the circuit carrier 1 and the housing 4.1, in particular the housing wall 4.1.1, of the component part 4. In particular, the contact-connection point KS, in particular a soldering point, of the contact element 4.2 to the contact opening 1.3 is sealed off so that, for example, the soldering material LM, in particular soldering tin, does not come into contact with the insulation element 4.1.3 of the component part 4. As a result, bypassing of the electrical insulation element 4.1.3 on account of the application of the soldering material LM is prevented.

For example, the seal element 5 is plugged onto a section 4.2.1 of the contact element 4.2 that projects out of the housing 4.1. In a further embodiment, the contact element 4.2 is provided with the seal element 5, for example by means of an applicable coating. The seal element 5 in this case completely seals off, in particular, the contact-connection point KS, that is to say the contact opening 1.3 and the contact element 4.2. In this case, the seal element 5 may have a plurality of contact-connection regions K1 to K3 both to the circuit carrier 1 and to the contact element 4.2 and to the housing 4.1 of the component part 4.

If the contact element 4.2 is only partly soldered, the contact element 4.2 is at least partly surrounded by the seal element 5 in the region of the contact opening 1.3.

The seal element 5 is formed, for example, as an O-ring. Furthermore, the seal element 5 may be at least partly formed from plastic or from another electrically non-conductive material. In particular, a shape of the seal element 5 is able to be adapted to a shape of the contact element 4.2. In this case, the contact element 4.2 and the seal element 5 are fixedly connected to one another at least by means of a form-fitting connection.

Furthermore, the seal element 5 may be provided as a spacer between the circuit carrier 1 and the housing 4.1 of the electronic component part 4.

Figure 4:
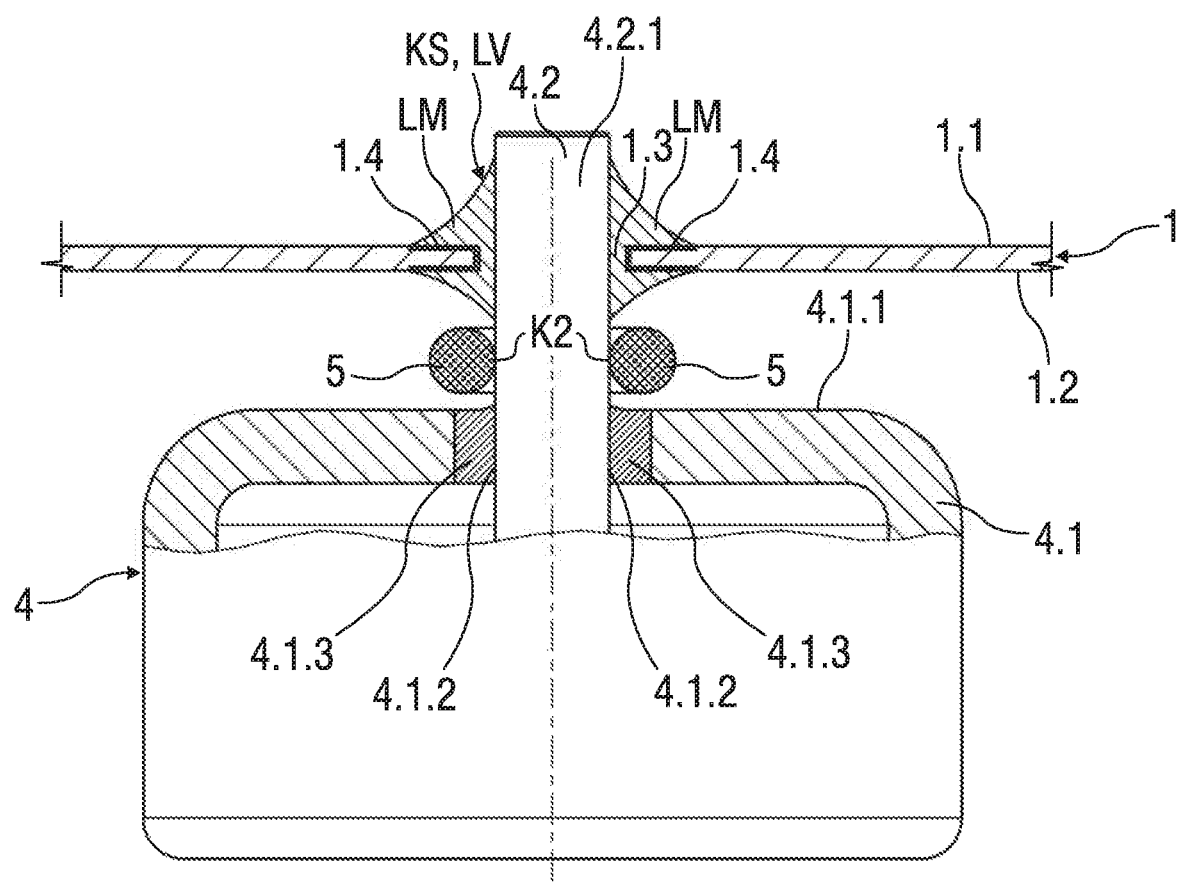
Figure 5:
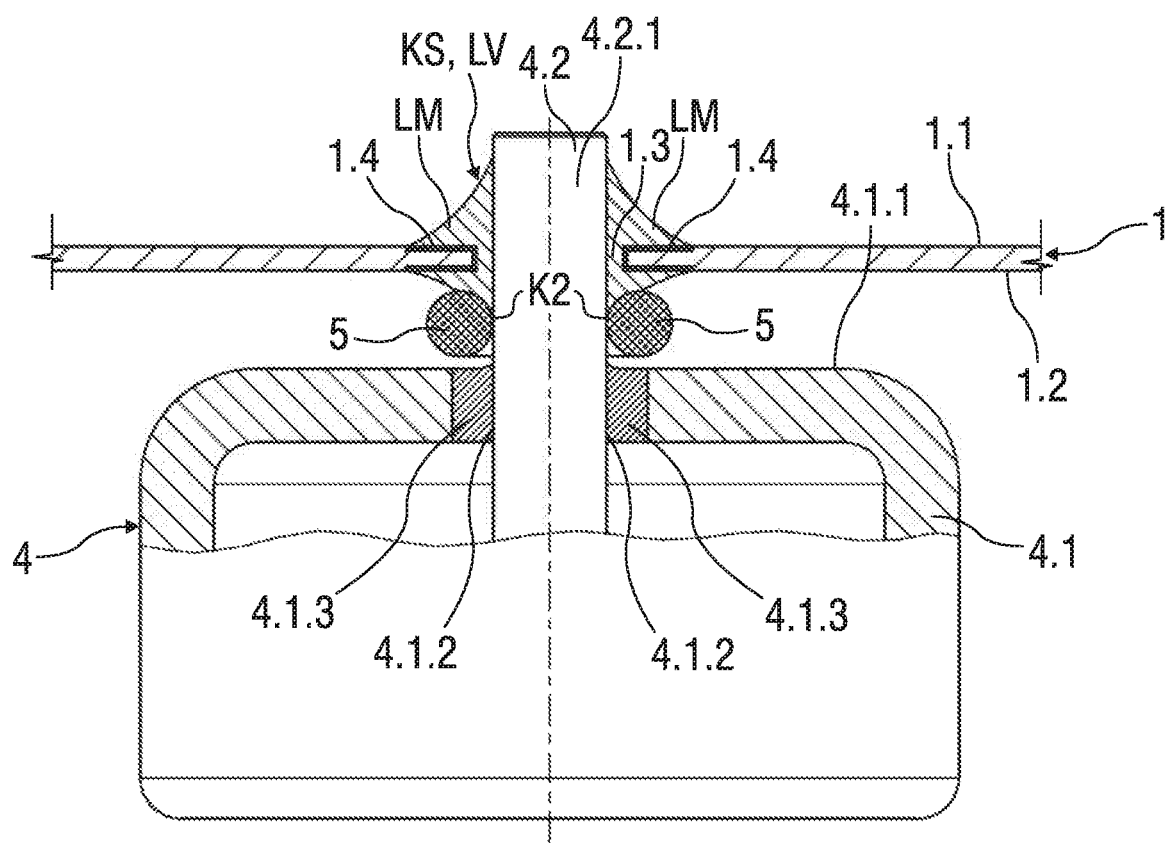

FIGS. 4 and 5 each show a further exemplary embodiment of the electronic component part 4 connected to the circuit carrier 1.

In the exemplary embodiments illustrated, the seal element 5 has in each case the contact-connection region K2 to the contact element 4.2. Furthermore, the seal element 5 is in each case arranged at a distance from the bottom surface side 1.2 and from the housing 4.1 of the component part 4. In one illustration, which is not shown in any more detail, the seal element 5 is arranged at a distance only from the circuit carrier 1 or from the component part 4.

The electrical contact element 4.2 of the component part 4 is connected in a materially bonded manner to the contact opening 1.3 of the circuit carrier 1.

To form the materially bonded connection, in particular the soldering connection LV, the contact opening 1.3 includes a soldering land 1.4, which, for example, encircles the contact opening 1.3. In particular, both the top surface side 1.1 and the bottom surface side 1.2 of the circuit carrier 1 is provided in each case with a soldering land 1.4 in the region of the contact opening 1.3. For example, the contact opening 1.3 is formed as a via, wherein the contact opening 1.3 and the surface sides 1.1, 1.2 form a soldering surface area. For example, the contact opening 1.3 is covered with a copper sleeve. Therefore, a respective contact-connection point KS to the contact element 4.2 is formed on both surface sides 1.1, 1.2 by means of the soldering connection LV.

If the seal element 5 is arranged at a distance, for example, from the circuit carrier 1, in particular from the bottom surface side 1.2, the soldering material LM may spread out up to the seal element 5. As a result, a comparatively larger soldering connection LV is able to be achieved, for example.

A reduction or even prevention of temperature influence or transmission on or to the component part 4 is made possible, in particular in the region of the insulation element 4.1.3, on account of the soldering connection LV, for example, by means of the seal element 5 at a distance from the component part 4, in particular the housing 4.1 of the component part 4.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. An electronic component, comprising:
   at least one circuit carrier;
   a plurality of component parts connected to the at least one circuit carrier;
   at least one contact opening formed as part of the at least one circuit carrier, each of the plurality of component parts further comprising:
      at least one electrically conductive housing;
      at least one electrical contact element projecting out of the at least one electrically conductive housing, the at least one electrical contact element being insulated from the housing and being connected at least in a materially bonded manner to the at least one contact opening of the circuit carrier to form at least one of a mechanical or electrical contact-connection point such that at least one of the plurality of component parts is at a distance from the at least one circuit carrier;
   at least one seal element arranged in the region of the at least one contact-connection point, in particular between the circuit carrier and the housing of the component part.

2. The electronic component of claim 1, wherein the at least one contact-connection point is produced by means of a soldering connection.

3. The electronic component of claim 1, wherein the at least one electrical contact element is secured in and to the contact opening by means of the soldering connection.

4. The electronic component of claim 1, the contact opening further comprising a via.

5. The electronic component of claim 4, the via further comprising a plurality of soldering lands.

6. The electronic component of claim 1, wherein the contact element is at least partly surrounded by the seal element.

7. The electronic component of claim 1, the seal element further comprising a contact-connection region, wherein the contact-connection region is in contact with the contact element of a corresponding one of the plurality of component parts.

8. The electronic component of claim 1, wherein the at least one seal element is arranged at a distance from the circuit carrier or from the at least one electrically conductive housing.

9. The electronic component of claim 1, the at least one seal element further comprising:
   a plurality of contact-connection regions;
   wherein a first of the plurality of contact-connection regions is in contact with the at least one circuit carrier, a second of the plurality of contact-connection regions is in contact with the at least one electrical contact element, and a third of the plurality of contact-connection regions is in contact with the at least one electrically conducive housing.

10. The electronic component of claim 1, the at least one seal element further comprising an O-ring.

11. The electronic component of claim 1, wherein the at least one seal element is at least partly formed from plastic.

12. The electronic component of claim 1, each one of the plurality of component parts further comprising:
   a housing wall being part of the at least one electrically conducive housing, the housing wall oriented in the direction of the circuit carrier; and a passage opening integrally formed as part of the housing wall, which electrically insulates the at least one electrical contact element and serves for feeding through the contact element.

13. The electronic component of claim 12, wherein the passage opening is provided with an electrical insulation element, through which the contact element is able to be fed.

14. The electronic component of claim 1, the at least one electrical contact element further comprising an electrical contact pin.

15. The electronic component of claim 1, each of the plurality of the component parts further comprising a mechanical component part or an electrical component part.

16. The electronic component of claim 1, each of the plurality of the component parts further comprising a mechanical and an electrical component part.

17. A method for producing an electronic component, comprising the steps of:
   providing a circuit carrier;
   providing at least one contact opening which is formed as part of the circuit carrier;
   providing at least one component part;
      providing at least one electrically conductive housing which is part of the at least one component part;
      providing at least one electrical contact element which is insulated from and fed through to the outside of the at least one electrically conductive housing, the at least one electrical contact element being part of the at least one component part;
      providing at least one mechanical or electrical contact-connection point;
      providing at least one seal element is arranged in the region of the contact-connection point, in particular between the circuit carrier and the at least one electrically conductive housing;
   populating the circuit carrier with the at least one component parts;
   connecting the at least one electrical contact element to the at least one contact opening of the circuit carrier at least in a materially bonded manner to form the at least one contact-connection point, such that the at least one component part is arranged at a distance from the circuit carrier.

18. The method of claim 17, further comprising the steps of providing the contact-connection point to be a soldering material.

19. The method of claim 18, further comprising the steps of soldering the electrical contact element in or to the at least one contact opening formed in the circuit carrier.

20. The method of claim 17, further comprising the steps of sealing off the contact-connection point from the housing by the at least one seal element.

21. The electronic component of claim 17, the at least one component part further comprising a mechanical component part or an electrical component part.

22. The electronic component of claim 17, the at least one component part further comprising a mechanical and an electrical component part.

* * * * *